US011830729B2

United States Patent
Shen et al.

(10) Patent No.: US 11,830,729 B2
(45) Date of Patent: Nov. 28, 2023

(54) LOW-K BORON CARBONITRIDE FILMS

(71) Applicant: Applied Materials, Inc., Santa Clara, CA (US)

(72) Inventors: Zeqing Shen, San Jose, CA (US); Bo Qi, San Jose, CA (US); Abhijit Basu Mallick, Fremont, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 7 days.

(21) Appl. No.: 17/144,972

(22) Filed: Jan. 8, 2021

(65) Prior Publication Data
US 2022/0223409 A1 Jul. 14, 2022

(51) Int. Cl.
*H01L 21/02* (2006.01)

(52) U.S. Cl.
CPC .. *H01L 21/02274* (2013.01); *H01L 21/02112* (2013.01); *H01L 21/02205* (2013.01)

(58) Field of Classification Search
CPC ......... H01L 21/02274; H01L 21/02112; H01L 21/02205; C23C 16/36; C23C 16/509
See application file for complete search history.

(56) References Cited

U.S. PATENT DOCUMENTS

| | | | | |
|---|---|---|---|---|
| 6,165,891 A * | 12/2000 | Chooi | ............... | H01L 21/76807 438/692 |
| 6,352,921 B1 * | 3/2002 | Han | .................. | H01L 23/53295 438/638 |
| 6,482,477 B1 * | 11/2002 | Westhoff | ........... | H01L 21/28556 427/535 |
| 7,144,803 B2 * | 12/2006 | Engbrecht | ............. | H01L 21/318 257/E21.547 |
| 8,476,743 B2 * | 7/2013 | Nguyen | ............ | H01L 21/02274 427/113 |
| 10,083,834 B2 * | 9/2018 | Thompson | ............ | H01L 21/321 |
| 2004/0157472 A1 * | 8/2004 | Sugino | .............. | H01L 21/02274 438/783 |

(Continued)

OTHER PUBLICATIONS

Kosinova et al, "Chemical Composition of Boron Carbonitride Films Grown by Plasma-Enhanced Chemical Vapor Deposition from Trimethylamineborane" Inorganic amterials vol. 36, No. 4, 2003, pp. 366-373 (Year: 2003).*

(Continued)

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary methods of semiconductor processing may include providing a boron-and-carbon-and-nitrogen-containing precursor to a processing region of a semiconductor processing chamber. A substrate may be disposed within the processing region of the semiconductor processing chamber. The methods may include generating a capacitively-coupled plasma of the boron-and-carbon-and-nitrogen-containing precursor. The methods may include forming a boron-and-carbon-and-nitrogen-containing layer on the substrate. The boron-and-carbon-and-nitrogen-containing layer may be characterized by a dielectric constant below or about 3.5.

20 Claims, 2 Drawing Sheets

(56) References Cited

U.S. PATENT DOCUMENTS

| | | |
|---|---|---|
| 2017/0207088 A1* | 7/2017 | Kwon ............... H01L 21/31144 |
| 2017/0309476 A1 | 10/2017 | Venkatasubramanian et al. |
| 2018/0277370 A1 | 9/2018 | Kwon et al. |
| 2018/0330939 A1 | 11/2018 | Pore |
| 2019/0097000 A1 | 3/2019 | Berry et al. |
| 2020/0388532 A1 | 12/2020 | Ding et al. |

OTHER PUBLICATIONS

International Search Report and Written Opinion dated Apr. 22, 2022 in International Patent Application No. PCT/US2022/011216, 9 pages.

* cited by examiner

LOW-K BORON CARBONITRIDE FILMS

TECHNICAL FIELD

The present technology relates to methods and components for semiconductor processing. More specifically, the present technology relates to systems and methods for producing low-k films for semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, resistance and capacitance characteristics for the formed structures may have a greater effect on device performance. To limit detrimental effects that may be caused by reduced device spacing, utilizing films characterized by a lower dielectric constant may improve operation. However, these materials may also be characterized by a lower modulus, which may challenge use in integration.

Thus, there is a need for improved systems and methods that can be used to produce high quality devices and structures. These and other needs are addressed by the present technology.

SUMMARY

Exemplary methods of semiconductor processing may include providing a boron-and-carbon-and-nitrogen-containing precursor to a processing region of a semiconductor processing chamber. A substrate may be disposed within the processing region of the semiconductor processing chamber. The methods may include generating a capacitively-coupled plasma of the boron-and-carbon-and-nitrogen-containing precursor. The methods may include forming a boron-and-carbon-and-nitrogen-containing layer on the substrate. The boron-and-carbon-and-nitrogen-containing layer may be characterized by a dielectric constant below or about 3.5.

In some embodiments, a pressure within the semiconductor processing chamber may be maintained above or about 1 Torr while forming the boron-and-carbon-and-nitrogen-containing layer. A pressure within the semiconductor processing chamber may be maintained below or about 10 Torr while forming the boron-and-carbon-and-nitrogen-containing layer. A plasma power may be maintained below or about 500 W while generating the capacitively-coupled plasma. The boron-and-carbon-and-nitrogen-containing layer may be characterized by a boron-to-nitrogen ratio of greater than or about 1:1. The boron-and-carbon-and-nitrogen containing layer may be characterized by a boron concentration of greater than or about 40%. Once exposed to atmosphere, the boron-and-carbon-and-nitrogen-containing layer may be characterized by an oxygen incorporation of less than or about 15%. The boron-and-carbon-and-nitrogen-containing layer may be characterized by a Young's modulus of greater than or about 50 Gpa. The methods may include forming a plasma of a nitrogen-containing precursor. The methods may include pre-treating the substrate with plasma effluents of the nitrogen-containing precursor prior to providing the boron-and-carbon-and-nitrogen-containing precursor. The methods may include providing a nitrogen-containing precursor with the boron-and-carbon-and-nitrogen-containing precursor. The methods may include exposing the boron-and-carbon-and-nitrogen containing layer to an anneal process characterized by a temperature above or about 750° C.

Some embodiments of the present technology may encompass semiconductor processing methods. The methods may include providing a boron-and-carbon-and-nitrogen-containing precursor to a processing region of a semiconductor processing chamber. A substrate may be disposed within the processing region of the semiconductor processing chamber. The methods may include generating a capacitively-coupled plasma of the boron-and-carbon-and-nitrogen-containing precursor at a plasma power level below or about 500 W. A pressure within the processing region of the semiconductor processing chamber may be maintained between about 1 Torr and about 12 Torr. The methods may include forming a boron-and-carbon-and-nitrogen-containing layer on the substrate.

In some embodiments, the boron-and-carbon-and-nitrogen-containing layer may be characterized by a dielectric constant of less than or about 3. The boron-and-carbon-and-nitrogen-containing layer may be characterized by a carbon concentration of greater than or about 15%. The methods may include forming a plasma of a nitrogen-containing precursor. The methods may include pre-treating the substrate with plasma effluents of the nitrogen-containing precursor. The boron-and-carbon-and-nitrogen-containing layer may be characterized by a boron-to-nitrogen ratio of greater than or about 1:1. The boron-and-carbon-and-nitrogen-containing precursor may be characterized by including at least three methyl moieties. The methods may include providing a nitrogen-containing precursor with the boron-and-carbon-and-nitrogen-containing precursor.

Some embodiments of the present technology may encompass semiconductor processing methods. The methods may include providing a boron-and-carbon-and-nitrogen-containing precursor to a processing region of a semiconductor processing chamber. A substrate may be disposed within the processing region of the semiconductor processing chamber. The boron-and-carbon-and-nitrogen-containing precursor may be characterized by having at least two methyl moieties bonded with nitrogen. The methods may include generating a capacitively-coupled plasma of the boron-and-carbon-and-nitrogen-containing precursor. The methods may include forming a boron-and-carbon-and-nitrogen-containing layer on the substrate.

In some embodiments, generating the capacitively-coupled plasma may include forming a plasma at a plasma power level below or about 500 W. A pressure within the processing region of the semiconductor processing chamber may be maintained between about 1 Torr and about 12 Torr. The boron-and-carbon-and-nitrogen-containing layer may be characterized by a dielectric constant of less than or about 3.5. The boron-and-carbon-and-nitrogen containing layer may be characterized by a Young's modulus of greater than or about 50 Gpa.

Such technology may provide numerous benefits over conventional systems and techniques. For example, embodiments of the present technology may produce materials characterized by lower dielectric constants. Additionally, the present technology may produce films characterized by increased Young's modulus, which may allow the films to be incorporated into integration flows where anneal processes may be included. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
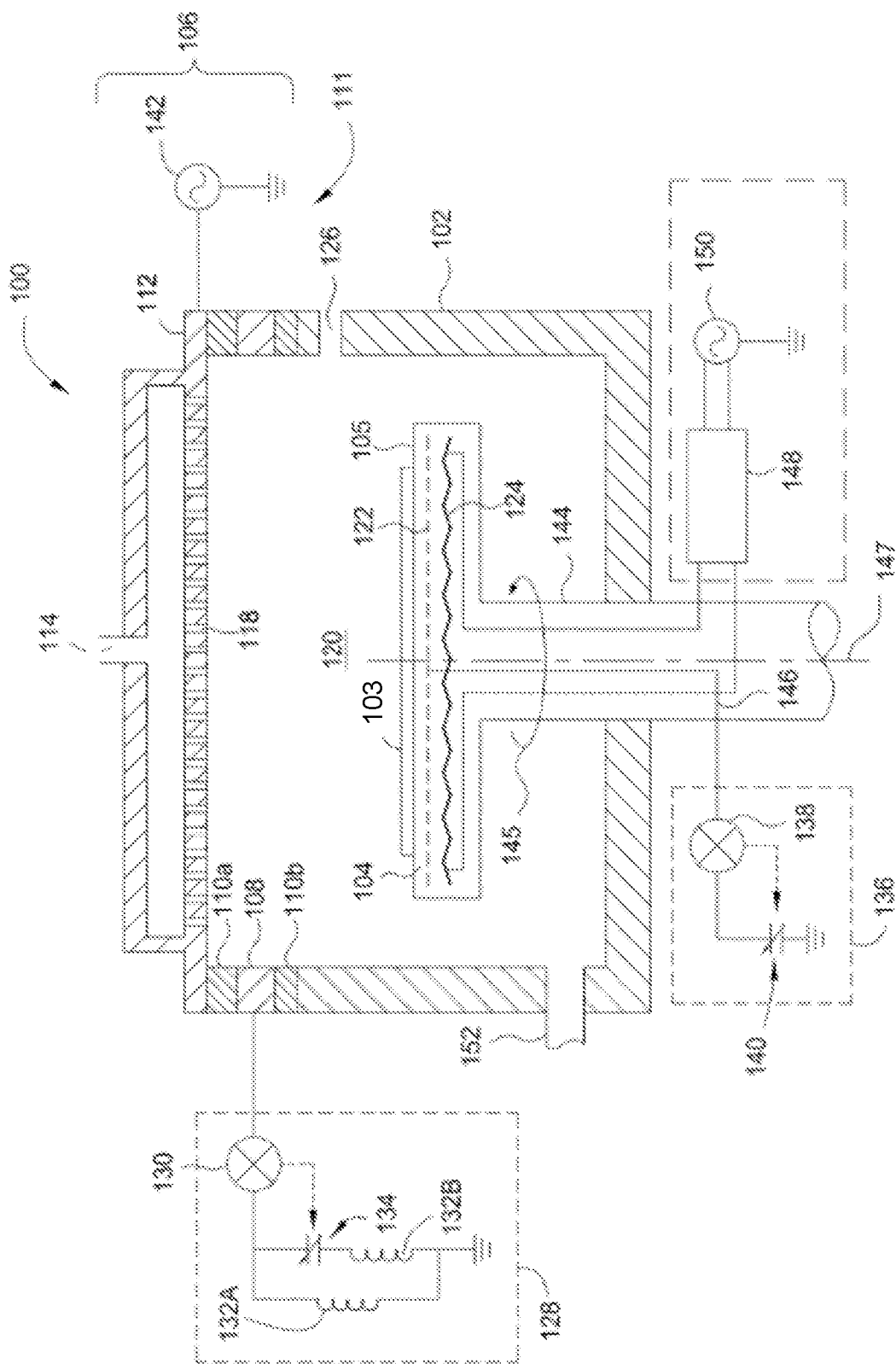
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. As structures are brought closer together within a device, dielectric materials may play an important role in limiting crosstalk and other electrical issues. Current materials may be incapable of sufficiently reduced dielectric constants without sacrificing material properties of the film. For example, by adjusting film properties to lower dielectric constant with some materials, the Young's modulus of the film may reduce, which may be a reduction in the film strength to withstand subsequent processing. As one non-limiting example, logic processing may include a back-end-of-line anneal process that may expose structures to temperatures exceeding 600° C. or more. Films characterized by lower strength may shrink, which may lead to structural damage.

Conventional technologies have struggled to produce films with sufficiently low dielectric constants that also maintain structural requirements. The present technology overcomes these issues by performing a plasma-enhanced deposition process of a boron carbonitride film. By producing the film under conditions that overcome the competing characteristics of dielectric constant and film strength, materials that may be included in integration may be formed, and which may also be characterized by low dielectric constant. The process performed may allow increased tuning of the films being produced, affording films characterized by a variety of material properties for different applications.

Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of producing boron and carbon films are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Boron nitride is used in semiconductor processing for a number of processes, but may be incapable of providing a low-k characteristic that may be used in integration. However, by incorporating carbon into the structure to produce a boron carbonitride, the dielectric constant may be further reduced. Thermal formation of boron carbonitride may be incapable of producing a viable path for low-k, higher modulus films. Although the dielectric constant may be tuned slightly to a range below 5, lower dielectric constant numbers may be a challenge. Additionally, the film produced may be characterized by an increased amount of leakage, and lower breakdown voltage due to the structure produced by a thermal bonding process. By performing a plasma-enhanced deposition, the present technology may overcome the issues with dielectric constant as well as electrical properties, and may also provide increased hardness over many conventional films.

Figure 2:
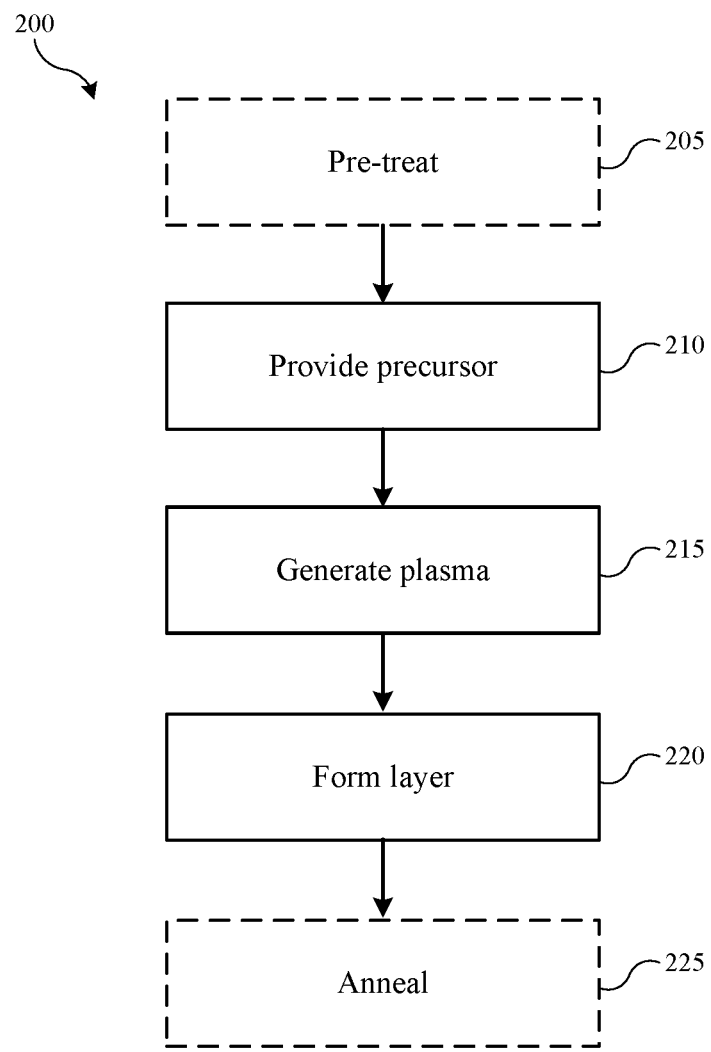
FIG. 2 shows operations in a semiconductor processing method according to some embodiments of the present technology.

Turning to FIG. 2 is shown exemplary operations in a processing method 200 according to some embodiments of the present technology. The method may be performed in a variety of processing chambers, including processing chamber 100 described above, as well as any other chambers including non-plasma chambers, in which the operations may be performed. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may include a processing method that may include a number of operations for developing a boron-and-carbon-and-nitrogen-containing film, which may be characterized by a lower dielectric constant, while maintaining sufficient physical properties. As will be explained further below, by controlling the process conditions by which the film is formed, dielectric constant may be further reduced while maintaining increased Young's modulus.

In some embodiments, method 200 may optionally include a pre-treatment of a substrate surface at optional operation 205. By pre-treating the surface of the substrate, adhesion of the film may be improved by producing favorable termination between the substrate and the film. The pre-treatment may be or include a thermal process, or may include a plasma-enhanced process. Processing conditions may be maintained during the film formation, as will be discussed below, which may facilitate production of the low-k, higher modulus films. The treatment may include delivery of a hydrogen-containing precursor, a nitrogen-containing precursor, or some other precursor. Exemplary precursors may include hydrogen, ammonia, or other hydrogen-containing or nitrogen-containing precursors, among other materials that may pre-treat the substrate.

At operation 210, the method may include providing a boron-and-carbon-and-nitrogen-containing precursor to the processing region of a semiconductor processing chamber where a substrate may be housed. At operation 215, a plasma may be formed of the precursor, such as a capacitively-coupled plasma, which may form a boron-and-carbon-and-nitrogen-containing layer on the substrate at operation 220. By maintaining processing conditions discussed below, the boron-and-carbon-and-nitrogen-containing layer, such as boron carbonitride, may be characterized by a dielectric constant of less than or about 4.0, and may be characterized by a dielectric constant of less than or about 3.9, less than or about 3.8, less than or about 3.7, less than or about 3.6, less than or about 3.5, less than or about 3.4, less than or about 3.3, less than or about 3.2, less than or about 3.1, less than or about 3.0, less than or about 2.9, less than or about 2.8, or less.

The plasma power at which the processing is performed may impact the film growth, as well as a variety of properties of the film. For example, carbon incorporation within the film may allow the dielectric constant to be reduced by incorporating additional methyl groups within the film. However, during plasma processing, methyl moieties may be decomposed relatively easily, and carbon may then simply be exhausted from the chamber. Additionally, as plasma power increases, bombardment of the film may increase, which may remove pores and densify the film, and which may further increase the film dielectric constant. Accordingly, in some embodiments, the plasma may be generated at a plasma power of less than or about 500 W, and may be generated at less than or about 450 W, less than or about 400 W, less than or about 350 W, less than or about 300 W, less than or about 250 W, less than or about 200 W, less than or about 150 W, less than or about 100 W, less than or about 50 W, or less.

Similarly, the pressure at which the process may be performed may impact aspects of the process as well. For example, as pressure increases, absorption of atmospheric water may increase, which may increase the dielectric constant of the film. As pressure is maintained lower, hydrophobicity of the film may increase. Accordingly, in some embodiments the pressure may be maintained at less than or about 10 Torr to afford production of sufficiently low dielectric constant, and the pressure may be maintained at less than or about 9 Torr, less than or about 8 Torr, less than or about 7 Torr, less than or about 6 Torr, less than or about 5 Torr, less than or about 4 Torr, less than or about 3 Torr, less than or about 2 Torr, less than or about 1 Torr, less than or about 0.5 Torr, or less. However, to maintain plasma parameters to facilitate film formation, the pressure may be maintained above or about 0.5 Torr, and may be maintained above or about 1 Torr, or higher.

Because of the plasma process producing the precursor decomposition in some embodiments, the semiconductor processing chamber, the pedestal, or the substrate may be maintained at a temperature below or about 500° C., and in some embodiments may be maintained at a temperature that is less than or about 475° C., less than or about 450° C., less than or about 425° C., less than or about 400° C., less than or about 375° C., less than or about 350° C., less than or about 325° C., less than or about 300° C., less than or about 275° C., less than or about 250° C., less than or about 225° C., less than or about 200° C., less than or about 175° C., less than or about 150° C., less than or about 125° C., less than or about 100° C., less than or about 75° C., or less.

A number of factors may impact the nitrogen, carbon, and boron concentration within the films. For example, in some embodiments, the produced film as deposited may be limited to or consist essentially of boron, carbon, nitrogen, and hydrogen, along with any trace materials, which may account for contaminants, for example. Additionally, after exposure to atmosphere, an amount of oxygen incorporation may occur. In some embodiments, the boron concentration may be greater than or about 30%, and may be greater than or about 32%, greater than or about 34%, greater than or about 36%, greater than or about 38%, greater than or about 40%, greater than or about 42%, greater than or about 44%, greater than or about 46%, or more. Similarly, the carbon concentration may be greater than or about 12%, and may be greater than or about 14%, greater than or about 16%, greater than or about 18%, greater than or about 20%, greater than or about 22%, greater than or about 24%, greater than or about 26%, greater than or about 28%, greater than or about 30%, or more. The nitrogen concentration may be greater than or about 20%, and may be greater than or about 22%, greater than or about 24%, greater than or about 26%, greater than or about 28%, greater than or about 30%, greater than or about 32%, greater than or about 34%, greater than or about 36%, greater than or about 38%, or more. Once exposed to atmosphere, the film may include any amount of oxygen incorporation, which may be maintained at less than or about 15%, and may be maintained at less than or about 14%, less than or about 13%, less than or about 12%, less than or about 11%, less than or about 10%, less than or about 9%, less than or about 8%, or less. Films according to some embodiments of the present technology may be more hydrophobic, as noted above, and thus although the films may absorb an amount of oxygen, the oxygen may not be hydroxyl oxygen. Accordingly, the oxygen incorporated in the film may have a more limited impact on raising the dielectric constant.

While carbon or methyl groups may facilitate lower dielectric constant within the film, a boron-to-nitrogen ratio within the film may affect the film hardness and modulus. Accordingly, in some embodiments, the boron-to-nitrogen ratio may be maintained at greater than or about 1:1, and may be maintained at greater than or about 1.2:1, greater than or about 1.4:1, greater than or about 1.6:1, greater than or about 1.8:1, greater than or about 2:1, or higher. The carbon-to-boron ratio may also facilitate the beneficial properties of films according to some embodiments of the present technology. For example, carbon incorporation may detrimentally impact film hardness in a general sense, although when sufficiently bonded with boron based on the film growth characteristics, hardness and modulus may be improved.

By producing films according to embodiments of the present technology, Young's modulus may be maintained at greater than or about 40 GPa in the deposited film, and may be maintained at greater than or about 42 GPa, greater than or about 44 GPa, greater than or about 46 GPa, greater than or about 48 GPa, greater than or about 50 GPa, greater than or about 52 GPa, greater than or about 54 GPa, greater than or about 56 GPa, greater than or about 58 GPa, greater than or about 60 GPa, greater than or about 62 GPa, or higher. Additionally, the film hardness may be maintained at greater than or about 4.0 GPa, and may be maintained at greater than or about 4.1 GPa, greater than or about 4.2 GPa, greater than or about 4.3 GPa, greater than or about 4.4 GPa, greater than or about 4.5 GPa, greater than or about 4.6 GPa, greater than or about 4.7 GPa, greater than or about 4.8 GPa, or higher. These properties may be produced without additional treatment, such as UV or other processes.

Precursors utilized in processes according to some embodiments of the present technology may include one or more precursors including boron, carbon, and/or nitrogen in the precursor. For example, the present technology may utilize any boron-and-carbon-and-nitrogen-containing precursor in some embodiments. Non-limiting exemplary precursors may be or include tris(dimethylamino)borane, dimethylamine borane, trimethylamine borane, triethylamine borane, tetrakis(dimethylamino)diborane, or any other precursor including one or more of boron, carbon, and/or nitrogen. Additional precursors may be included in some embodiments to adjust atomic ratios. For example, additional hydrogen-containing precursors, or nitrogen-containing precursors such as ammonia, may be included along with carrier or inert gases, such as argon, nitrogen, helium, or other materials.

As noted previously, the present technology may produce films that may have sufficient properties to be included in integration processing. For example, films produced according to some embodiments of the present technology may be exposed during downstream processing to a high-temperature anneal at optional operation 225, which may exceed temperatures of 700° C., and may be performed at temperatures of greater than or about 750° C., greater than or about 800° C., greater than or about 850° C., or higher. Because of the higher modulus and other properties of films produced by some embodiments of the present technology, the low-k materials may not be damaged by the anneal process, affording additional integration operations for low-k materials.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:
1. A semiconductor processing method comprising:
providing a boron-and-carbon-and-nitrogen-containing precursor to a processing region of a semiconductor processing chamber, wherein a substrate is disposed within the processing region of the semiconductor processing chamber;
generating a capacitively-coupled plasma of the boron-and-carbon-and-nitrogen-containing precursor at a plasma power below or about 500 W; and
forming a boron-and-carbon-and-nitrogen-containing layer on the substrate, wherein the boron-and-carbon-and-nitrogen-containing layer is characterized by a dielectric constant below or about 3.5, and wherein the boron-and-carbon-and-nitrogen-containing layer is characterized by a boron concentration of greater than or about 40%.
2. The semiconductor processing method of claim 1, wherein a pressure within the semiconductor processing chamber is maintained above or about 1 Torr while forming the boron-and-carbon-and-nitrogen-containing layer.

3. The semiconductor processing method of claim 2, wherein a pressure within the semiconductor processing chamber is maintained below or about 10 Torr while forming the boron-and-carbon-and-nitrogen-containing layer.

4. The semiconductor processing method of claim 1, wherein the boron-and-carbon-and-nitrogen-containing layer is characterized by a boron-to-nitrogen ratio of greater than or about 1:1.

5. The semiconductor processing method of claim 1, wherein, once exposed to atmosphere, the boron-and-carbon-and-nitrogen-containing layer is characterized by an oxygen incorporation of less than or about 15%.

6. The semiconductor processing method of claim 1, wherein the boron-and-carbon-and-nitrogen-containing layer is characterized by a Young's modulus of greater than or about 50 Gpa.

7. The semiconductor processing method of claim 1, further comprising:
forming a plasma of a nitrogen-containing precursor; and
pre-treating the substrate with plasma effluents of the nitrogen-containing precursor prior to providing the boron-and-carbon-and-nitrogen-containing precursor.

8. The semiconductor processing method of claim 1, further comprising:
providing a nitrogen-containing precursor with the boron-and-carbon-and-nitrogen-containing precursor.

9. The semiconductor processing method of claim 1, further comprising:
exposing the boron-and-carbon-and-nitrogen-containing layer to an anneal process characterized by a temperature above or about 750° C.

10. A semiconductor processing method comprising:
providing a boron-and-carbon-and-nitrogen-containing precursor to a processing region of a semiconductor processing chamber, wherein a substrate is disposed within the processing region of the semiconductor processing chamber;
generating a capacitively-coupled plasma of the boron-and-carbon-and-nitrogen-containing precursor at a plasma power level below or about 500 W, wherein a pressure within the processing region of the semiconductor processing chamber is maintained between about 1 Torr and about 12 Torr; and
forming a boron-and-carbon-and-nitrogen-containing layer on the substrate, wherein the boron-and-carbon-and-nitrogen-containing layer is characterized by a boron concentration of greater than or about 40%.

11. The semiconductor processing method of claim 10, wherein the boron-and-carbon-and-nitrogen-containing layer is characterized by a dielectric constant of less than or about 3.

12. The semiconductor processing method of claim 10, wherein the boron-and-carbon-and-nitrogen-containing layer is characterized by a carbon concentration of greater than or about 15%.

13. The semiconductor processing method of claim 10, further comprising:
forming a plasma of a nitrogen-containing precursor; and
pre-treating the substrate with plasma effluents of the nitrogen-containing precursor.

14. The semiconductor processing method of claim 10, wherein the boron-and-carbon-and-nitrogen-containing layer is characterized by a boron-to-nitrogen ratio of greater than or about 1:1.

15. The semiconductor processing method of claim 10, wherein the boron-and-carbon-and-nitrogen-containing precursor is characterized by including at least three methyl moieties.

16. The semiconductor processing method of claim 10, further comprising:
providing a nitrogen-containing precursor with the boron-and-carbon-and-nitrogen-containing precursor.

17. A semiconductor processing method comprising:
providing a boron-and-carbon-and-nitrogen-containing precursor to a processing region of a semiconductor processing chamber, wherein a substrate is disposed within the processing region of the semiconductor processing chamber, and wherein the boron-and-carbon-and-nitrogen-containing precursor is characterized by having at least two methyl moieties bonded with nitrogen;
generating a capacitively-coupled plasma of the boron-and-carbon-and-nitrogen-containing precursor at a plasma power level below or about 500 W; and
forming a boron-and-carbon-and-nitrogen-containing layer on the substrate, wherein the boron-and-carbon-and-nitrogen-containing layer is characterized by a boron concentration of greater than or about 40%.

18. The semiconductor processing method of claim 17, wherein a pressure within the processing region of the semiconductor processing chamber is maintained between about 1 Torr and about 12 Torr.

19. The semiconductor processing method of claim 17, wherein the boron-and-carbon-and-nitrogen-containing layer is characterized by a dielectric constant of less than or about 3.5.

20. The semiconductor processing method of claim 17, wherein the boron-and-carbon-and-nitrogen-containing layer is characterized by a Young's modulus of greater than or about 50 Gpa.

* * * * *